(12) United States Patent
Roehrig et al.

(10) Patent No.: US 7,709,727 B2
(45) Date of Patent: May 4, 2010

(54) CIRCUIT ARRANGEMENT FOR A PHOTOVOLTAIC SYSTEM

(76) Inventors: Ruediger Roehrig, Kufsteiner Platz 2, Muenchen (DE) 81679; Josef Steger, An der Lerau 26, Vohenstrauss (DE) 92648

( * ) Notice: Subject to any disclaimer, the term of this patent is extended or adjusted under 35 U.S.C. 154(b) by 1445 days.

(21) Appl. No.: 10/514,488

(22) PCT Filed: May 19, 2003

(86) PCT No.: PCT/DE03/01611

§ 371 (c)(1),
(2), (4) Date: Nov. 15, 2004

(87) PCT Pub. No.: WO03/098703

PCT Pub. Date: Nov. 27, 2003

(65) Prior Publication Data

US 2005/0172995 A1    Aug. 11, 2005

(30) Foreign Application Priority Data

May 17, 2002   (DE) ................................ 102 22 621

(51) Int. Cl.
*H01L 31/00*    (2006.01)
*H01L 25/00*    (2006.01)
(52) U.S. Cl. ...................... 136/243; 136/244; 136/265; 136/293
(58) Field of Classification Search ................. 136/243, 136/244, 265, 293
See application file for complete search history.

(56) References Cited

U.S. PATENT DOCUMENTS 6,225,793 B1 *   5/2001   Dickmann .................. 323/230

FOREIGN PATENT DOCUMENTS

| DE | 40 32 569 A1 | 4/1992 |
|----|--------------|--------|
| DE | 19502762 A1 * | 8/1996 |
| DE | 198 38 229 A1 | 2/2000 |
| DE | 199 04 561 C1 | 8/2000 |
| DE | 199 16 742 C1 | 8/2000 |
| EP | 0 460 453 A | 12/1991 |
| EP | 0 494 043 A1 | 7/1992 |
| EP | 1 045 455 A | 10/2000 |
| JP | 08 172209 A | 7/1996 |

* cited by examiner

*Primary Examiner*—Kishor Mayekar
(74) *Attorney, Agent, or Firm*—Rothwell, Figg, Ernst & Manbeck, P.C.

(57) ABSTRACT

The invention relates to a circuit arrangement for controlling/regulating photovoltaic systems (10b) which comprise a plurality of solar generators (14b) connected in series or/and connected in parallel. In order to prevent power loss of solar generators, which is based on the fact that not all solar generators are operated in the MPP thereof, each solar generator is associated with a variable energy bypass (68b) that is controlled/regulated in such a manner that each solar generator (14b) is operated continuously in its respective current specific MPP.

24 Claims, 16 Drawing Sheets

Method for the control and regulation of a photovoltaic system with variable current bypass Method for the control and regulation of a photovoltaic system with variable current bypass Circuit arrangement for the control and regulation of a photovoltaic system with variable current bypass

FIG. 15

CIRCUIT ARRANGEMENT FOR A PHOTOVOLTAIC SYSTEM

CROSS REFERENCE TO RELATED APPLICATION

This application is a 35 USC §371 National Phase Entry Application from PCT/DE03/01611, filed May 19, 2003, and designating the U.S.

BACKGROUND OF THE INVENTION

1. Field of the Invention

The invention relates to a circuit arrangement for controlling/regulating photovoltaic systems that comprise a plurality of solar generators connected in series and/or in parallel.

2. Description of Related Art

It is generally known that photovoltaic solar generators perform optimally only if the generator is operated at a specific operating point, i.e., the maximum power point, which is referred to as MPP in the following. With each generator, the MPP depends on the respective external operating conditions, in particular the current radiation intensity and the temperature as well as the condition of the generator itself, in particular as a condition of production tolerances, age, defects, contaminations, etc. For these reasons, each generator has a specific MPP current $I_{MPP}$ and/or a specific MPP voltage $U_{MPP}$.

It is furthermore generally known that in photovoltaic systems, solar generators are connected in series to so-called strings so as to obtain specific output voltages. Depending on the desired output power, an appropriate number of strings are connected in parallel. The serial connection causes the current flowing through all of the solar generators of a string to be of the same strength. However, differences in the MPP currents of the individual solar generators of a string lead to a loss of performance of the photovoltaic system because not every solar generator can be operated in its optimal operating range.

The object to be attained by the invention is to reduce performance losses of solar generators connected in series and/or parallel.

SUMMARY OF THE INVENTION

In accordance with the present invention, this problem is solved with a circuit arrangement for controlling/regulating photovoltaic systems, which comprises a plurality of solar generators connected in series and/or parallel, with each solar generator having an associated variable energy bypass that is controlled/regulated such that each solar generator is operated continuously in its respective actual specific MPP.

With solar generators that are connected in series to a string, for example, this is effected essentially in that each solar generator of a string has a variable current bypass that is controlled/regulated so that the current in the string is the same size as the lowest MPP current of all individual solar generators of the string. The differential current between the actual string current and the respective actual solar generator MPP current is guided through the current bypass. The sum current through the solar generator thus corresponds at all times specifically to its MPP current, which ensures an optimum operation of the solar generator. The control variable for the current bypass, which is different for each generator, is determined by comparing the own MPP and the MPP of the other solar generators in a string. This comparison can occur in a solar generator as well as in a string control/regulating unit that communicates with the control/regulating units of the individual solar generators through a data bus. The respective MPP of the individual generators can be determined in a simple manner by measuring the performance curve of the generators according to proven methods (electronically or capacitively changing load). The current guided through the bypass past the string current is again made available to the system in a suitable manner, for example through an inverter, to feed the energy into the network.

This bypass principle can be applied also with solar generators connected in parallel, with the circuit arrangement then not adjusting the current but rather the voltage of the respective solar generator to the voltage of the overall system.

To meet the requirements of solar generators that are connected in series and/or parallel, it may be provided that the energy bypass is controlled/regulated by current and/or voltage.

Furthermore, it may be provided that the energy bypass comprises a galvanically separating controllable/regulatable energy converter (for example in form of a controllable/regulatable DC/DC converter, a controllable/regulatable current- or voltage source, a current- or voltage divider [also referred to as bypass element in the following]). Thus, the output of the respective bypass circuit can be connected independent of the relevant voltage level of the respective solar generator and thus independent of the interconnection of the actual solar generators.

Furthermore, it may be provided that the solar generator in a plurality of solar generators connected in series, which has the respective actual lowest MPP current in the series, sets the controlling/regulating variable for the energy bypass of the other solar generators in the series. The reason for this, as already discussed earlier, is that solar generators connected in series into a string are a system of equal currents. The current through each of the solar generators connected in series is equal. For this reason, the current in the system is largely determined by the solar generator with the lowest MPP current. As a result of the bypass circuit, the appropriate differential current in solar generators with an MPP current higher than the MPP current of the weakest module is branched off and the corresponding energy is fed into an independent energy bypass path and/or -circle after potential separation and possible transformation.

Solar generators connected in parallel, on the other hand, are a system of equal voltage. The voltage on each of the solar generators connected in parallel is equal. However, because the MPP voltages of the individual solar generators deviate, an optimum operation is possible only by adjusting the voltage. Thus, the voltage in the system is determined largely by the solar generator having the lowest MPP voltage. Therefore, it can be provided that of a plurality of solar generators connected in parallel, the solar generator which has the respective currently lowest MPP voltage in the system sets the control/regulating variable for the energy bypass of the other solar generators in the system. Thus, the bypass circuit builds up the appropriate differential voltage in series to the respective solar generator in the solar generators having an MPP voltage that is greater than the MPP voltage of the weakest solar generator, and the corresponding energy is fed into an independent energy bypass path and/or -circle after potential separation and possible transformation.

Furthermore, it may be provided that at least one main energy path is provided and that the individual solar generators are connected together in series or/and in parallel through said main energy path. What is conceivable, for example, are solar cells connected in series as a module, solar cell groups connected in parallel, modules interconnected in series into a string, module groups connected in series, modules connected in parallel as well as strings connected in parallel.

So as to enable a combination of the individual energy bypasses, it may be provided that at least one energy bypass path is provided, and that the energy bypasses are connected in series or/and parallel through said energy bypass path, with the bypass circuit for solar generators connected in series being arranged in parallel to the respective solar generators, and the bypass circuit for the solar generators connected in parallel being arranged in series to the individual solar generators.

Energy bypass elements connected in parallel are, on their own, a system of equal voltage. The performance equivalent to be processed by the bypass circuit must be transformed into a uniform voltage. The performance equivalent is controlled/regulated accordingly by varying the strength of the current. The bypass current and the bypass voltage can be controlled either centrally by evaluating all measuring data of the individual solar generators, or partially independently by the controllable/regulatable bypass element itself.

Bypass elements connected in series, on the other hand, are on their own a system of equal currents. The performance equivalent to be processed by the bypass circuit must be transformed to a uniform current level. The performance equivalent is controlled accordingly by varying the current. The bypass current and the bypass voltage can be controlled either centrally by evaluating all measuring data of the individual solar generators, or partially independently by the controllable/regulatable bypass element itself.

To make the bypass energy available for use, it can furthermore be provided that the bypass energy path is connected to the main energy path, i.e., that the bypass energy can be guided back to the main energy path directly with appropriate control/regulation of the voltages and currents in the bypass energy path. For example, with bypasses connected in parallel, the voltage level of the bypass elements is adjusted to the level of the main energy path by centrally controlling/regulating the voltage and/or through the controllable/regulatable bypass element (such as controllable/regulatable DC/DC converters) itself, whereas in the case of by pass elements connected in series, the voltage of the bypasses is adjusted through central control/regulation of the voltage and/or, for example, through the controllable/regulatable bypass element itself, so that the sum of the voltages of the bypass elements connected in series and/or the bypasses corresponds to the voltage of the main energy path if the bypass elements and/or bypasses connected in series carry a uniform current.

Furthermore, it can be provided that the main energy path and/or the bypass energy path are connected to an energy network or a battery system, which can be achieved in network-coupled systems, for example, by associating an energy converter with the main energy path and/or the bypass energy path, or in battery systems by assigning respective charge controllers and storage batteries to the main energy path and/or the bypass energy path.

The invention furthermore relates to a circuit arrangement for controlling/regulating of photovoltaic systems that comprise a plurality of solar generators connected in series and/or parallel, characterized in that each solar generator or a part of the solar generators have an assigned diagnostic means that repeatedly records the operating parameters and/or ratings of the solar generator during the operation of the solar generator and performs an MPP determination of the solar generator, and that the diagnostic means has an assigned system decoupling means that separates the solar generator from the main energy path during the duration of recording the operating parameters and/or ratings.

The diagnostic unit can also be used to determine the respective solar generator and/or determine independently the MPP of the respective solar generator.

The principal idea of the component- and system diagnosis of photovoltaic systems is based on the measuring and calculation of the most important parameters and ratings (temperature, open-circuit voltage, short circuit voltage, current-voltage performance curve, MPP) of all solar generators connected in a circuit during operation. However, because with solar generators connected in series, i.e., solar generators connected into a string, for example, the current through each of the solar generators connected in series is the same size and the current in the system is influenced significantly by the module with the lowest MPP current, the calculation of the most important parameters and ratings during operation would lead to additional performance losses because of an interference of the imposed MPP tracking in an energy converter of the main energy path as a result of the required adjustment of the optimum operating point and thus the MPP, which is largely avoided, however, by separating the solar generator from the main energy path during the recording of the operating parameter and/or ratings data.

According to a preferred embodiment, it may be provided that a solar generator simulator is associated with the diagnostic means, and that said simulator replaces the solar generator during the duration of recording the operating parameters and/or ratings with respect to the energy output of said solar generator. This means that during the operation of the photovoltaic system, the ratings of a solar generator can be recorded without interrupting the energy flow and without any interference with the imposed control/regulating system. This is achieved by separating the solar generator from the system with the system decoupling unit for the duration of the measurement and by simultaneously activating the solar generator simulator, which has an energy source and replaces the solar generator during the duration of the measurement. In doing so, the solar generator simulator and/or the energy source are controlled/regulated such that the current and the voltage correspond exactly to the value of the solar generator prior to the start of the measuring cycle and the subsequent system decoupling. This ensures that there is no interference to the imposed control/regulation cycle, i.e., so that there is no interference to the imposed system and thus in particular to the MPP tracking of the system inverter during the measurement, the generator is decoupled from the system (string) for the duration of the measurement, and the flow of the current in the string is ensured by the solar generator simulator.

To measure the parameters of a solar cell, it can be provided, for example, that the diagnostic means comprises a temperature- and/or current- and/or voltage measuring unit to record the current operating parameters of the solar generator, and that an operating point control element is provided, which adjusts the operating point during the recording of the operating parameters and/or ratings, i.e., which adjusts the current load of the generator and thus determines the current operating point and/or varies the operating point to measure the parameters, while the resulting currents and voltages are measured. To illustrate a dynamic behavior of the system, the measurement is performed in a periodic cycle, with the respective module MPP being determined cyclically by appropriately evaluating the measuring points on the current-voltage performance curve, with the determination of the module MPP, however, also being possible with other known methods. The result of the measurement is the following: no-load supply current, short circuit current, MPP current and MPP voltage (calculated MPP performance), actual current and actual voltage (if the solar generator is interconnected in the system (calculated current performance)) and the actual temperature.

To enable a complete decoupling of the generator from the system for the duration of the measurement, it may also be provided that the system decoupling unit separates the solar generator from the bypass energy path as well for the duration of recording the operating parameters and/or ratings.

It may be provided that the solar generator simulator also supplies the bypass energy path with energy for the duration of recording the operating parameters and/or ratings, which ensures a very uniform energy output of the overall system.

The invention furthermore relates to a circuit arrangement having the characteristics related to the diagnostic means, characterized in that an additional variable energy bypass is associated with each solar generator.

Furthermore, it may be provided a control/regulation means to control/regulate the energy bypass and/or the diagnostic means is associated with each solar generator and/or a group of solar generators, although it is not ruled out that the control/regulation means also controls/regulates other components of the photovoltaic system as well, such as a communications means, etc.

Furthermore, each solar generator and/or a group of solar generators may have an associated data processing and memory unit to process and store measuring data, the ratings and the calculations values.

Furthermore, it may be provided that the circuit arrangement has an associated communication means, which permits a communication of the solar generator operating parameters and ratings to other solar generators and/or communication- and/or control means and/or data processing- and memory units, with the communication being effected over a separate data line or -bus and/or the main energy path and/or the bypass energy path. If the communication is effected through a main energy path, for example, this is achieved in that the communicating data are modulated on the main energy path by means of a modulation/demodulation unit.

The invention furthermore relates to a method for the control/regulation of photovoltaic systems comprising a plurality of solar generators connected in series and/or in parallel, characterized in that the MPP is determined only for a part of the connected solar generators to determine the system MPP and that the system MPP is derived from said value(s). This reduces performance losses during the MPP determination and/or the MPP tracking because the remaining solar generators are not affected by the MPP determination and/or the MPP tracking and remain at their respective operating point during the MPP determination and/or the MPP tracking and continue to provide the appropriate energy.

The possibility of monitoring the condition of the individual solar generators is provided automatically with the method in accordance with the invention by the data communication between the solar generator control/regulation units with one another and/or with an imposed control/regulation unit. If a plurality of strings is connected in parallel, an additional control/regulation unit can record and analyze the data communication of the entire photovoltaic system and thus function as the monitoring center for the monitoring of all system components.

The advantage achieved with the invention compared to the previous method for the control/regulation of photovoltaic systems is a higher performance yield, which is achieved by the simultaneous and quasi-continuous operation of all connected solar generators in their respective MPP (even at deviating performance curves). Furthermore, the contemporary recording of the operating conditions of all generators improves the safety, availability, reliability and maintainability of photovoltaic systems.

BRIEF DESCRIPTION OF THE DRAWINGS

The present invention is described in detail in the following with preferred embodiments and reference to the enclosed illustrations. They show:

FIG. 15 a schematic view of a bypass diagnostic unit for solar generators connected in parallel.

DETAILED DESCRIPTION OF THE PREFERRED EMBODIMENTS

Figure 1:
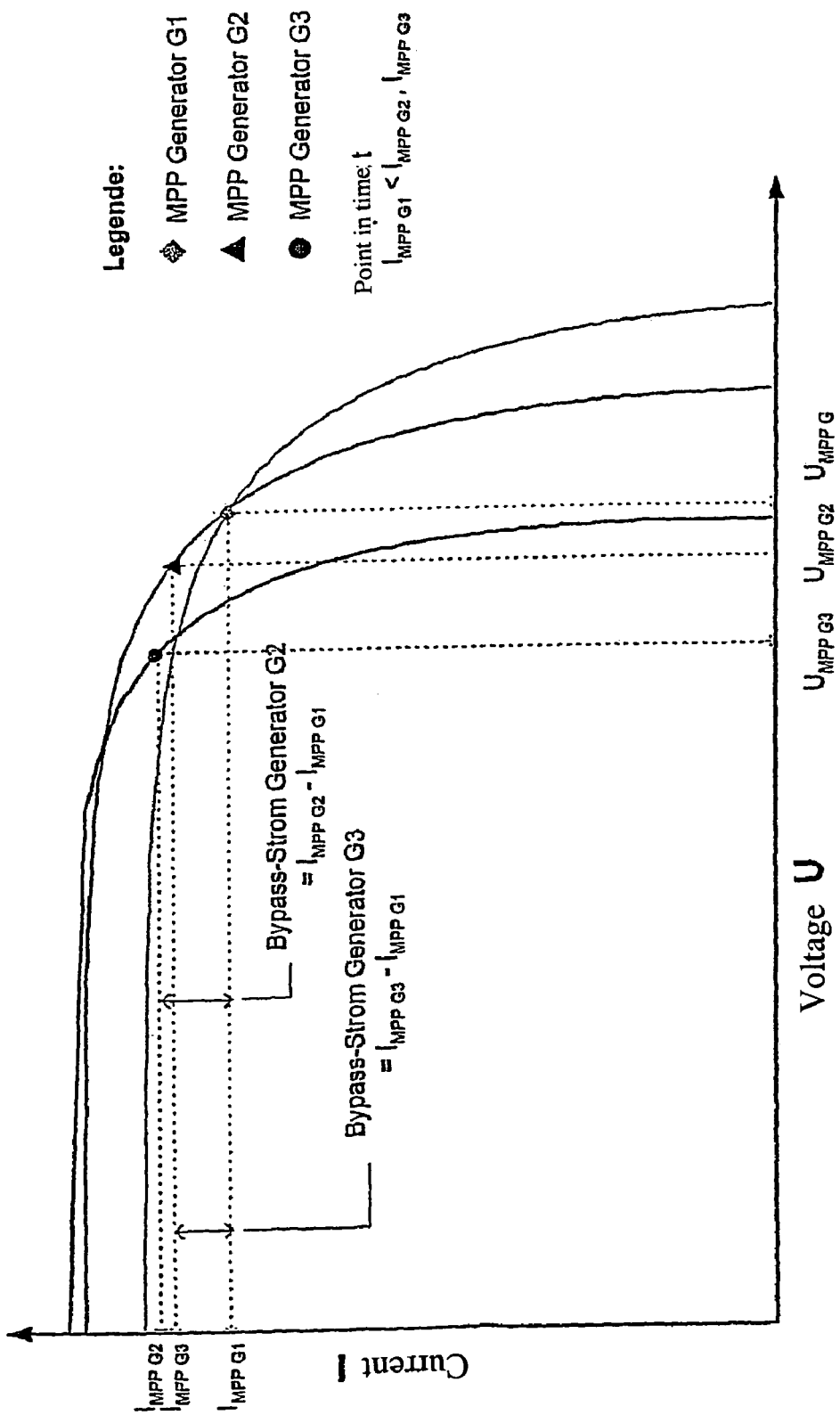
FIG. 1 the current-voltage performance curves of three arbitrary solar generators.
Figure 2:
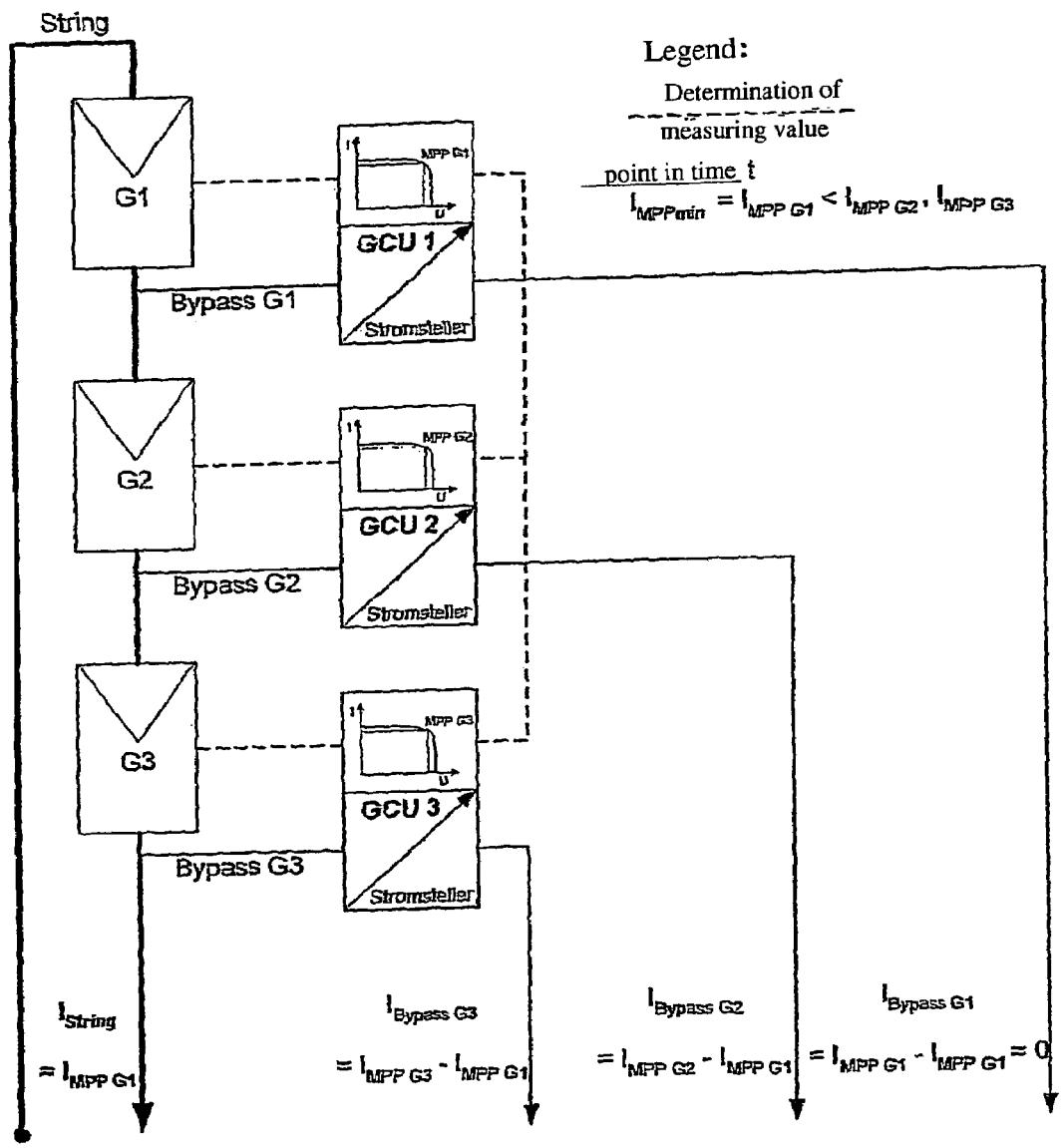
FIG. 2 a schematic view of a method for the control/regulation of a photovoltaic system with variable current bypass.
Figure 3:
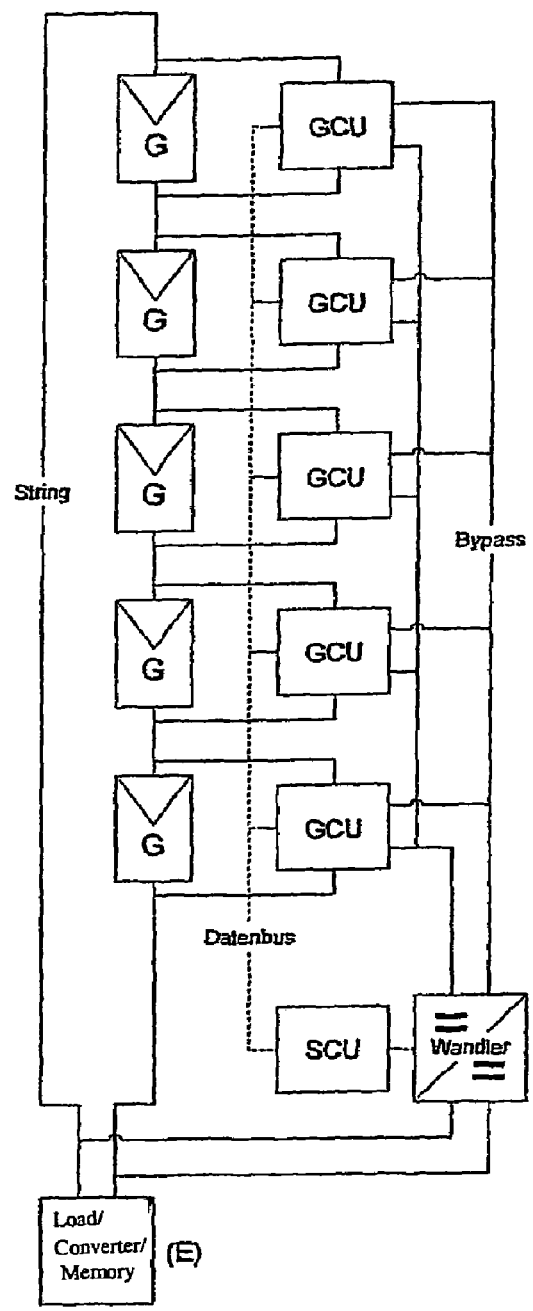
FIG. 3 a schematic view of a circuit arrangement for the control/regulation of a photovoltaic system with variable current bypass in an advantageous embodiment.

FIGS. 1 to 3 are used to explain the principle of a bypass control/regulation in a simplified manner.

FIG. 1 shows the current-voltage performance curve of three random generators G1, G2 and G3 at a specific point in time t. In this example, each generator has a specific MPP with the related current- and voltage values ($I_{MPP\ G1}$, $I_{MPP\ G2}$, $I_{MPP\ G3}$ and/or $U_{MPP\ G1}$, $U_{MPP\ G2}$, $U_{MPP\ G3}$), with $I_{MPP\ G1}$ being smaller than $I_{MPP\ G2}$ and smaller than $I_{MPP\ G3}$. If said three generators are connected in series into a string and loaded, a string current of uniform strength flows through all three generators so that at least two generators cannot be operated in their MPP. With the method in accordance with the invention (see FIG. 2) to operate the circuit arrangement in accordance with the invention, the string is loaded such that the string current is exactly the same size as $I_{MPP\ G1}$. Bypass currents are branched off from the generators G2 and G3, with the size of said bypass currents at said point in time t being the respective difference $I_{Bypass\ G2}=I_{MPP\ G2}-I_{MPP\ G1}$ and/or $I_{Bypass\ G3}=I_{MPP\ G3}-I_{MPP\ G1}$ FIG. 2 shows the method of bypass control/regulation and is explained on the basis of using the current-voltage performance curves of FIG. 1 as an example. After (On) each generator, a bypass is branched off the string (Bypass G1-G3). Each bypass has its own control/regulation unit (Generator Control Unit: GCU 1-3). At a specific point in time t, the individual GCUs of a string determine the U performance curve and thus the actual MPP of their respective generator according to the known method. The lowest MPP current is determined by communicating and comparing the actual MPP currents $I_{MPP\ G1}$ to $I_{MPP\ G3}$. Then the individual GCUs calculate the difference of their respective actual MPP current ($I_{MPP\ G1}-I_{MPP\ G3}$) and the lowest actual MPP current of all generators in the string ($I_{MPP\ G1}$ in the example) and load the appropriate bypass such that the specific calculated differential current is branched of with general circuit methods ($I_{Bpass\ G1}-I_{Bypass\ G3}$).

The energy equivalent of said load is provided to the system in a suitable manner (for example, DC/AC conversion is provided). At the same time, the MPP current flowing in the string at this exact point in time is the lowest one of all generators in the string. Thus, the sum current through each individual generator corresponds exactly to its respective MPP current and the maximum energy yield is guaranteed. After said process is completed, the method starts over again.

FIG. 3 shows the circuit arrangement for the control/regulation of a photovoltaic system with variable current bypass in an advantageous embodiment. A generator control/regulation unit (referred to as GCU in the following) is connected in parallel to each solar generator G of a string. Each GCU has a communication interface and a direct voltage output for the bypass current. The individual GCUs are connected to one another by a data bus. With larger photovoltaic systems (such as those greater than 2 kWp), the connection to a string control/regulation unit SCU may prove economical to perform the redundant calculation effort to determine the current lowest MPP current only once while at the same time simplifying the circuitry of the GCUs. The bypass sides of the individual GCUs are connected in parallel to one another. The bypass can be reconnected to the string at the energy transfer point E of the string through a galvanic separated DC/DC converter for a voltage-adapted energy return. Depending on the type of photovoltaic system, the energy transfer point may be characterized by a load, a converter or an accumulator.

The FIGS. 4 to 7 show additional embodiments of a circuit arrangement in accordance with the invention for the control/regulation of photovoltaic systems, which use a diagnostic means instead of an energy bypass to detect performance losses in solar generators connected in series and/or parallel and to reduce said performance losses by introducing appropriate measures.

It is known that the current-voltage performance curve of a solar generator depends on the incident light radiation and the temperature, and the maximum performance of the solar generator can be derived only at a specific time, the MPP, with appropriate MPP current. However, the performance curves of individual solar cells connected in a system may deviate. The reason for this, for example, is a deviation of the energy radiation based on natural deviation with respect to the local brightness distribution, contamination, shadows, temperature differences caused by the accumulation of heat, degradation of a cell or even technical defects such as hairline cracks resulting from mechanical or thermal load, mechanical destruction through vandalism or destruction through radiation effects. The deviating performance curves of individual cells lead to system-related losses in the serial and/or parallel connection of the solar cells i.e., the current and/or the voltage in the system is largely determined by the solar generator with the lowest MPP current and/or the lowest MPP voltage. Therefore, it is necessary to determine the parameters of the individual solar generators in more or less short intervals by a system diagnosis, which is effected with a temporary variation of the operating point and measuring the resulting currents and voltages. The respective solar generator MPP can also be determined cyclically with an appropriate evaluation of the measuring points on the current-voltage performance curve, although this can also be accomplished with other known methods.

A diagnostic unit suitable for this purpose is described in the following with reference to FIGS. 4 and 5 using the example of a network-coupled photovoltaic system 10. The photo voltaic system 10 comprises two strings 12 arranged in parallel, each of which has three solar generators 14 connected in series, which are connected through a GCU 16 (generator control/regulating unit with diagnostic unit) to a main energy path (line) 18 and through said path with an energy converter 20, such as an inverter, which converts the DC voltage generated by the solar generators into a network-conform AC voltage and feeds said voltage into an energy network 22. According to this form of the embodiment, the inverter 20 controls the load of the strings 12 with MPP tracking such that the maximum load can be derived and thus each string 12 is always operated in the string MPP (imposed control/regulation system).

Figure 5:
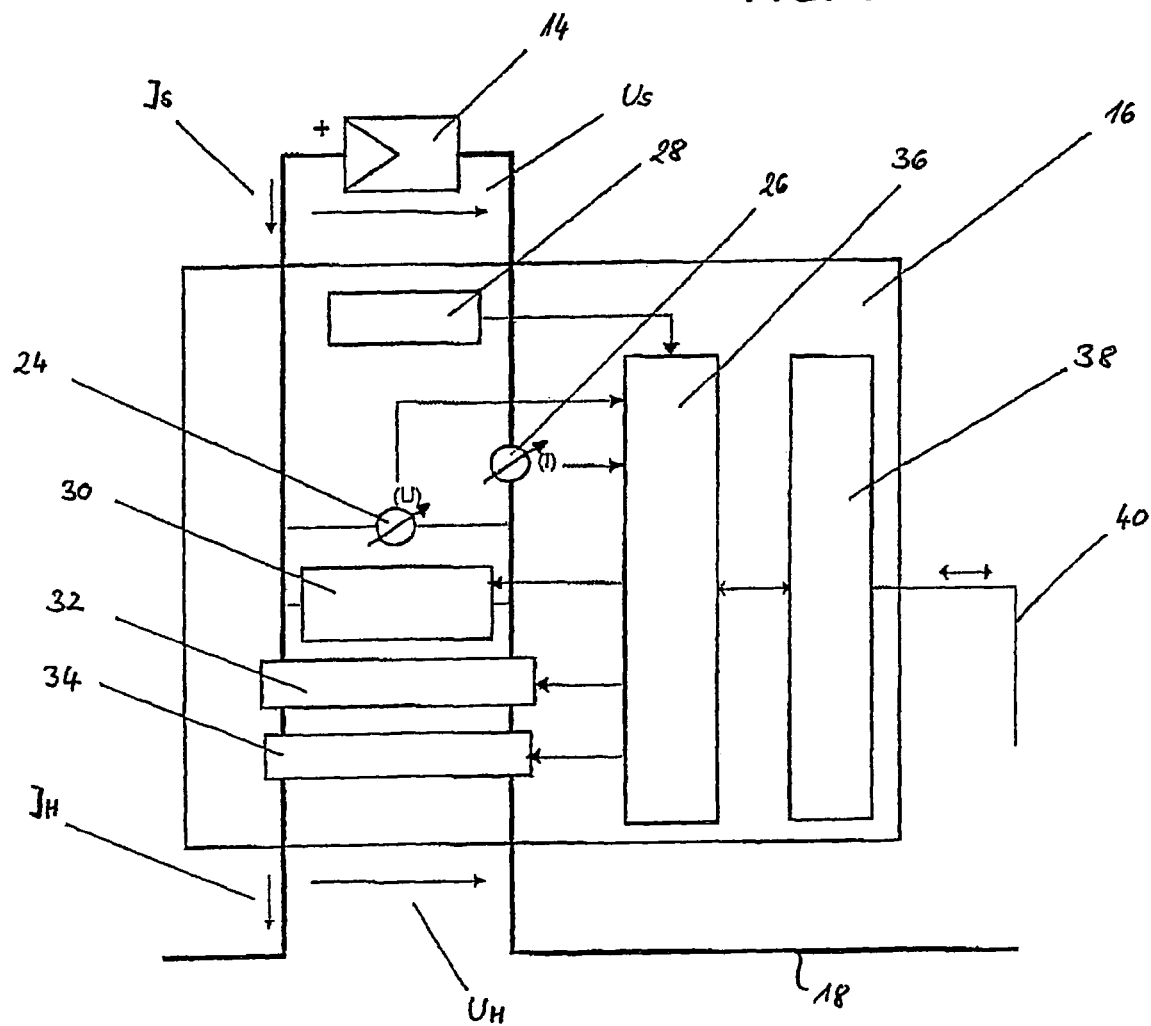
FIG. 5 a schematic view of a diagnostic unit with data bus.

As is shown in particular in FIG. 5, the GCU 16 is essentially comprised of a voltage measuring unit 24 to record the voltage in the respective operating point of the solar generator 14, a current measuring unit 26 to record the current in the respective operating point, a temperature measuring unit 28 to record the temperature of the solar generator, an operating point control element 30, a system decoupling unit 32, a solar generator simulator 34, a data processing- and memory unit 36 and a communication unit 38.

The principal idea of the component- and system diagnosis of photovoltaic power plants is based on the cyclical measurement and/or calculation of the most important parameters and ratings (temperature, no-load voltage, short circuit current, current-voltage performance curve, MPP) of all solar generators connected in a circuit in continuous operation. However, in order so as not to interrupt the flow of energy through a string during the measuring and/or calculation of the most important parameters and ratings or interfere with the imposed control/regulation system, the respective solar generator 14 and/or the GCU 16 is separated from the overall system by means of the system decoupling unit 32 and the solar generator simulator 34 is activated, with the energy source of said simulator being controlled/regulated such that the current and the voltage correspond exactly to the values of the solar generator prior to the start of the measuring cycle and the subsequent system decoupling, which guarantees that there is no interference with the imposed control circuit. More specifically, during the measuring cycle, the generator and the GCU are decoupled from the associated string 12 and replaced by an energy source having an energy level that corresponds to the value of the solar generator prior to the start of the measuring cycle.

For an optimized coupling of the system at global brightness changes and thus changes of the MPP and to reduce the losses in the determination of the MPP, the MPP determination is ideally performed in a very rapid cycle and initially not for all solar generators present and/or connected in the system, but only for one and/or individual solar generators. The variance of the generators relative to one another, on the other hand, is determined in an essentially slower cycle at a specific point in time by determining the MPP in all solar generators connected and/or present in the system.

Ideally, the result of the MPP determination is also used for the control/regulation of the central energy converter and/or to control an energy bypass. This makes an imposed MPP tracking obsolete, which always acts on all interconnected generators and thus also causes MPP tracking losses in all interconnected generators.

This method ensures that even without the use of an additional sensor, the MPP tracking losses are reduced to a minimum, a close coupling to global changes in brightness is achieved and the variance of the generators is taken into account.

The solar generator simulator can also be developed with automatic control/regulation.

After the solar generator 14 and the connected GCU 16 have been decoupled from the string 12 and the solar module simulator 34 has been activated, the operating point control element 30 is adjusted to open (no load, i=0) and the voltage Us at the solar generator 14 is measured with the voltage measuring unit 24. The measured voltage is the no-load voltage.

To measure the short circuit current, the operating point control element 30 is set to short circuit (maximum load U=O) and the solar generator current Is is measured with the current measuring unit 26.

By varying the operating point segment by segment, the performance curve of the solar generator 14 is scanned by measuring the respective voltage Us and the current Is. The product of current and voltage is the performance of the solar generator. At the point of highest performance (MPP-performance), the MPP current and the MPP voltage are measured.

To measure the current values in the system, the operating point control element 30 is deactivated and the solar generator is reintegrated into the imposed system (string 12) by deactivating the system decoupling unit 32, and the current Is and the voltage Us of the solar generator 14 are measured. The product is the actual performance/power of the solar generator 14. $U_H$ denotes the voltage of the main energy path and $I_H$ denotes the current of the main energy path.

The temperature is scanned by a sensor on the solar generator and processed by the GCU 16. The measuring data, ratings and calculation values are stored in the data processing- and memory unit 36. In addition, as shown schematically with arrows in FIG. 5, the data processing- and memory unit 36 controls/regulates the operating point control element 30, the system decoupling unit 32, the solar generator simulator 34 and also the communication unit 38, which is connected to a local management unit LMU 42 through a data bus 40, said local management unit 42 cyclically collects the measuring values, the calculated values and the ratings of all solar generators in the system and can also control/regulate the energy converter 20 through an additional data bus 44. Furthermore, in the present embodiment, the LMU 42 is connected to a global data network 48 (such as DFÜ, Internet) through an additional data bus 46. Based on the ratings and the current measuring data of the individual GCUs as well as the dynamic behavior, and taking into account the absolute time, the LMU 42 determines the current condition of each individual GCU 16.

The evaluation and comparison of the current and/or historic statistical and/or dynamic measuring data of all GCUs in the system with the help of appropriate algorithms and/or an expert system allows conclusions as to possible causes of errors. With appropriate feedback mechanisms, it is also possible to realize a learning diagnostic system or it is possible, based on long-term measurements, to make early prognoses concerning the future behavior of the system.

In addition, however, a global evaluation is also possible. Based on the detailed measuring data and ratings of the individual GCUs, a global processing unit GMU can provide conclusions about the quality of the entire system. Furthermore, economically optimized decisions can be made automatically.

The FIGS. 6 to 16 show additional embodiments of the circuit arrangement in accordance with the invention, with the components shown there corresponding to the components described initially with respect to construction and/or function and having the same reference symbols as well as additionally a respective index "a", "b", "c", "d", "e", "f", "g" and "h". The following discusses only the structural differences between the respective embodiments described above.

Figure 4:
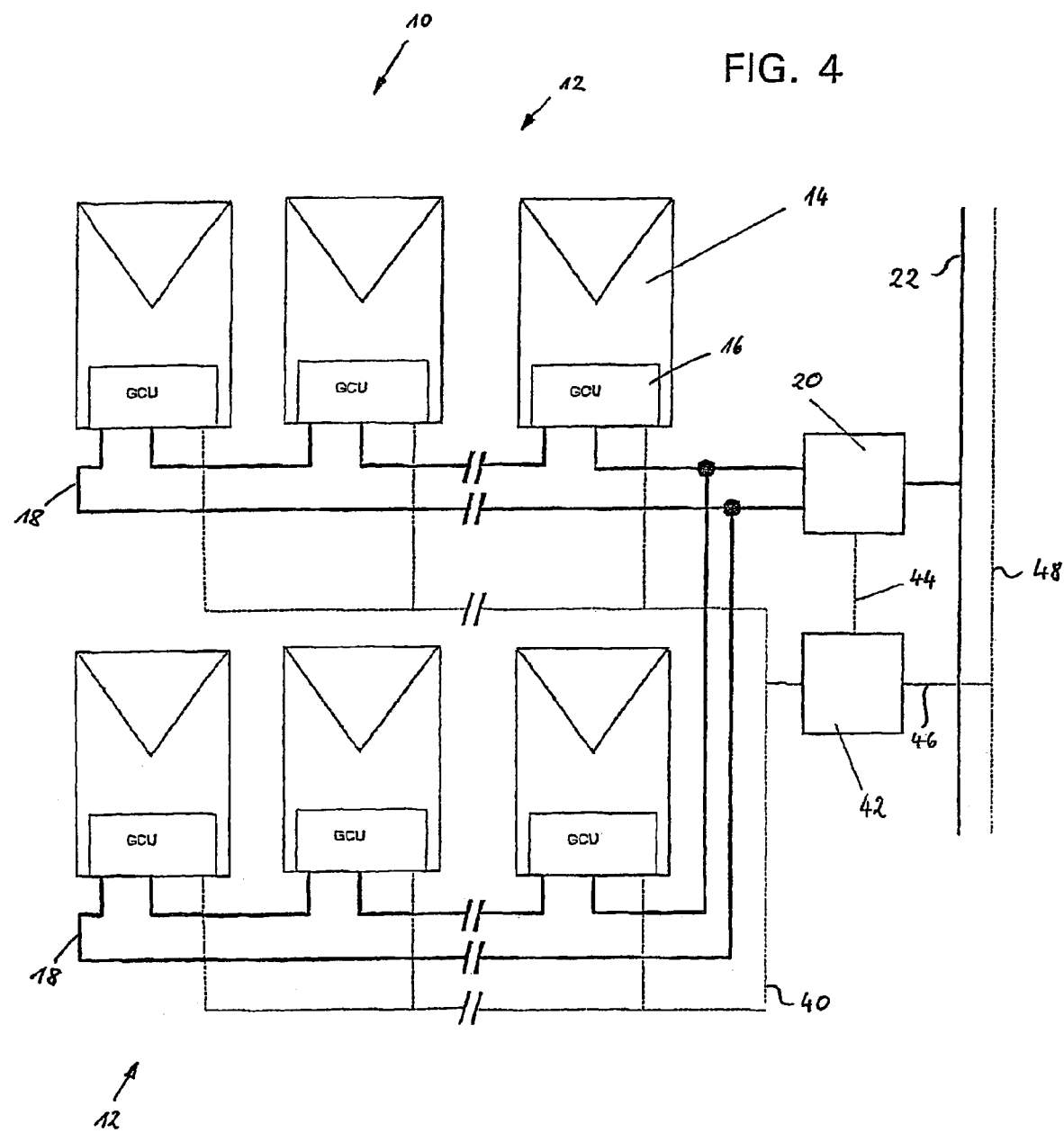
FIG. 4 a schematic view of a photovoltaic system with two parallel solar generator strings and solar generators with diagnostic unit.
Figure 6:
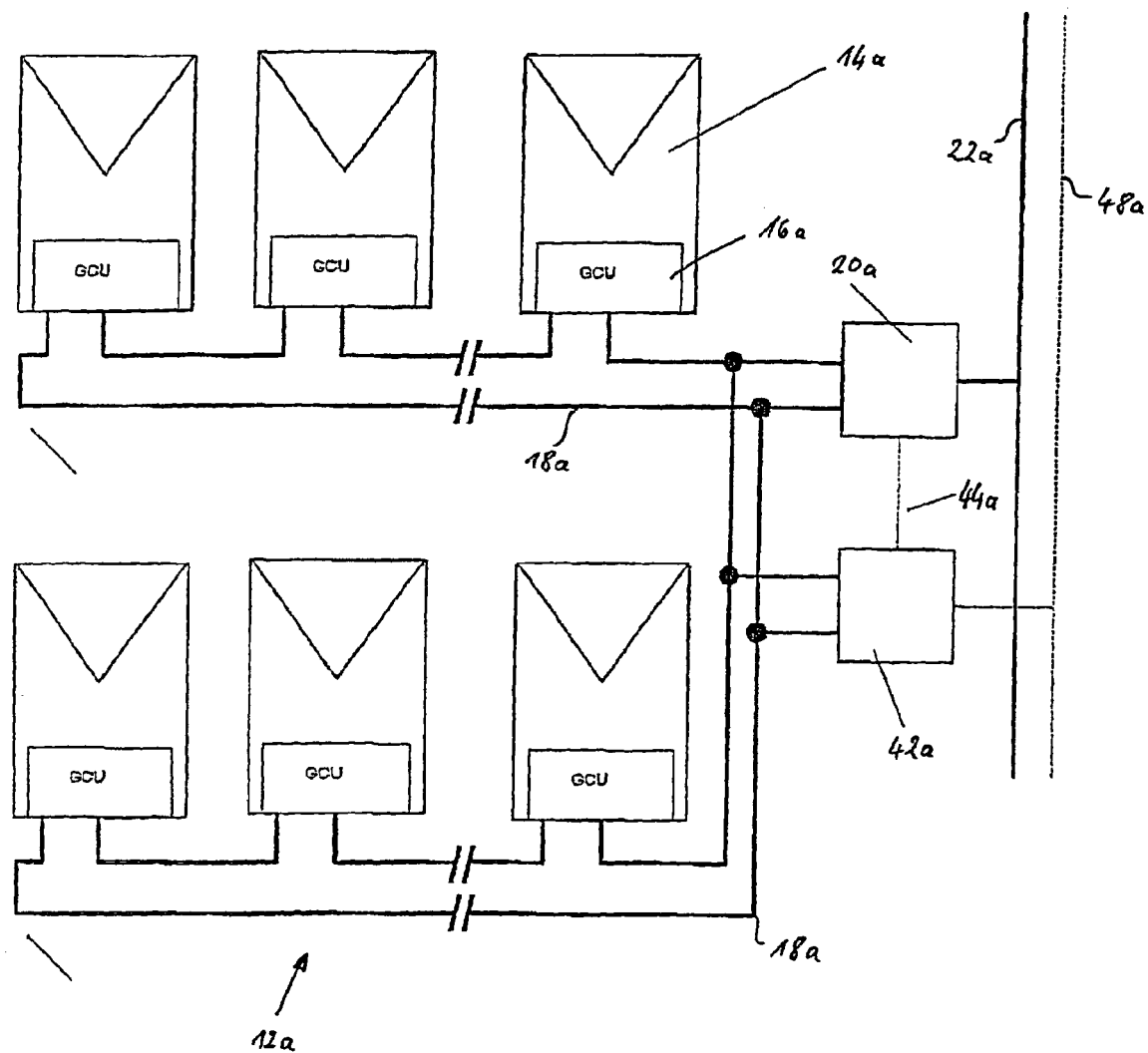
FIG. 6 a schematic view of a photovoltaic system with two parallel solar generator strings and solar generators with diagnostic unit according to another embodiment.
Figure 7:
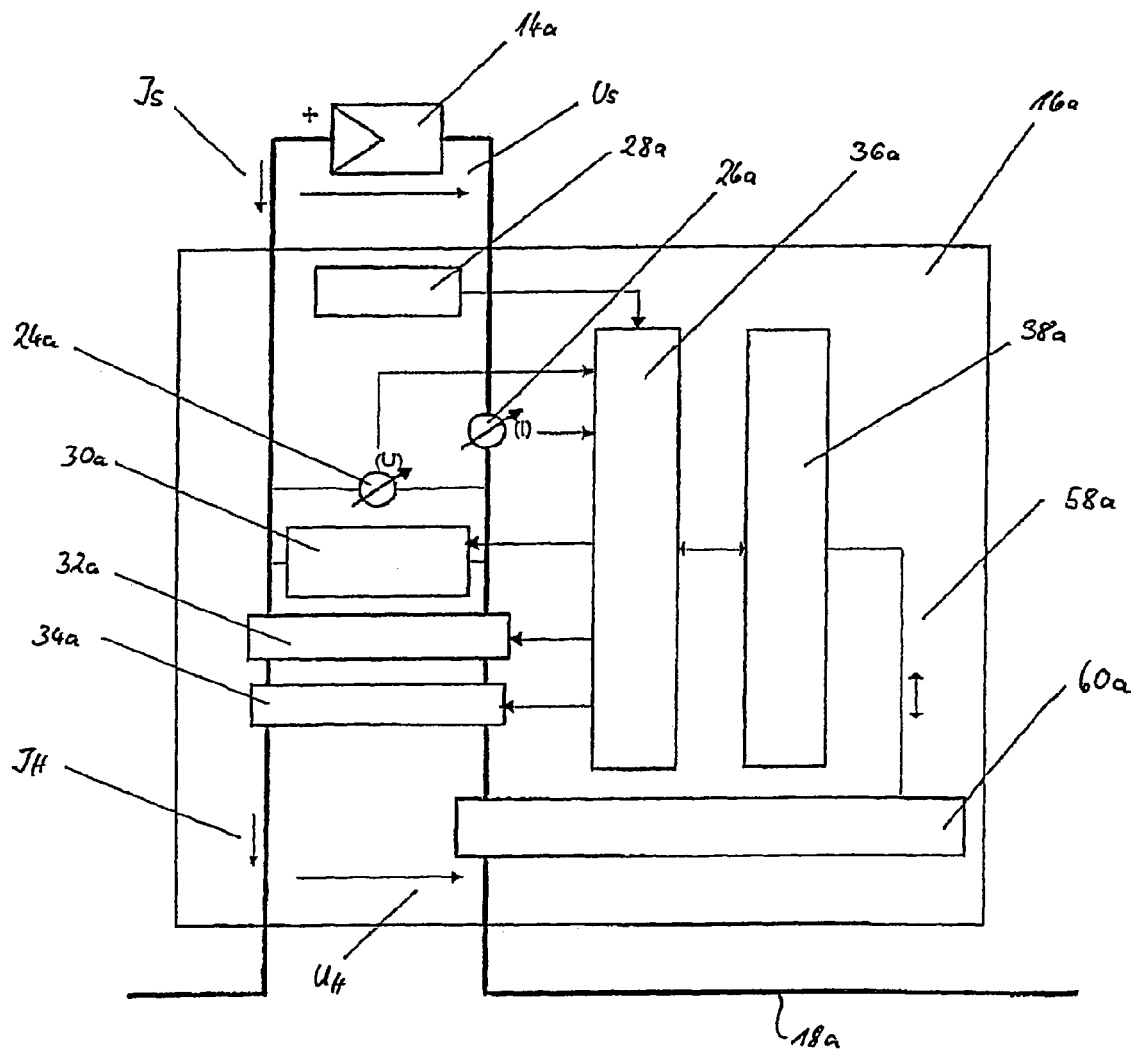
FIG. 7 a schematic view of a diagnostic unit with data coupling.

The only essential difference between the circuit arrangement according to FIGS. 6 and 7 and the circuit arrangement described above is that instead of the data bus 40 for the transmission of data between the communication unit 38 and the LMU 42, a modulation/demodulation unit (data coupler/decoupler) 60a connected to the communication unit 38a through a data line 58a is provided, which modulates the data to be transmitted on the main energy line and/or the main energy path 18a, which then in turn are demodulated by the LMU 42a through an appropriate data coupler/decoupler (not shown) and transferred to a data network 48a and/or an energy converter 20a according to FIG. 4.

The two circuit arrangements described above allow the cyclical measurement of the module parameters of the individual solar generators in a photovoltaic system without interfering with the imposed control/regulation circuit and causing substantial performance losses in the photovoltaic system. Furthermore, it is possible to quickly and easily localize solar cells with insufficient performance, which negatively impact the overall performance of the system, and take appropriate counter measures. However, unlike the embodiment described with reference to FIGS. 1 to 3, the difference in the performance in MPP relative to the performance in the current operated operating point is lost, and is a measure for the quality of the overall system. However, this negative performance can be made available again to the overall system with the help of an energy bypass and appropriate energy transformation.

Figure 8:
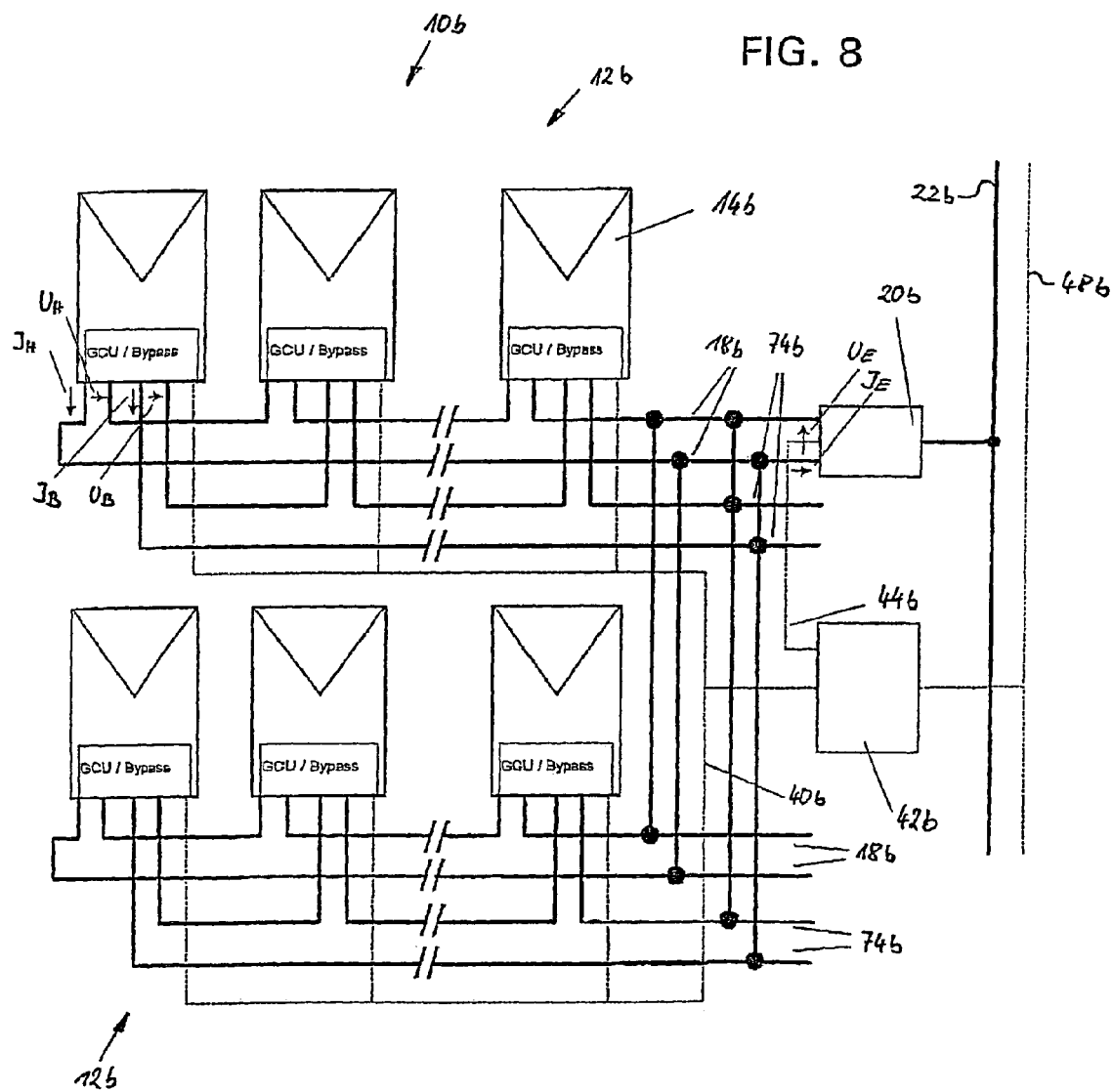
FIG. 8 a schematic view of a photovoltaic system with two parallel solar generator strings, solar generators with bypass/diagnostic unit and energy bypass connected in series with direct feed into the main energy path.

The circuit arrangement shown in FIG. 8 is essentially based on the circuit arrangement according to FIG. 4 described earlier, but with the difference that in this embodiment, each solar generator 14b not only has an associated diagnostic means, but also an associated variable energy bypass that is controlled/regulated so that each solar generator 14 b is operated continuously in its respective actual specific MPP. The energy bypass can be used for the system optimization of photovoltaic systems as well as on cell-, module- and/or string basis with various circuit variants, with the photovoltaic elements and appropriate circuits generally being called solar generator in the following.

Figure 9:
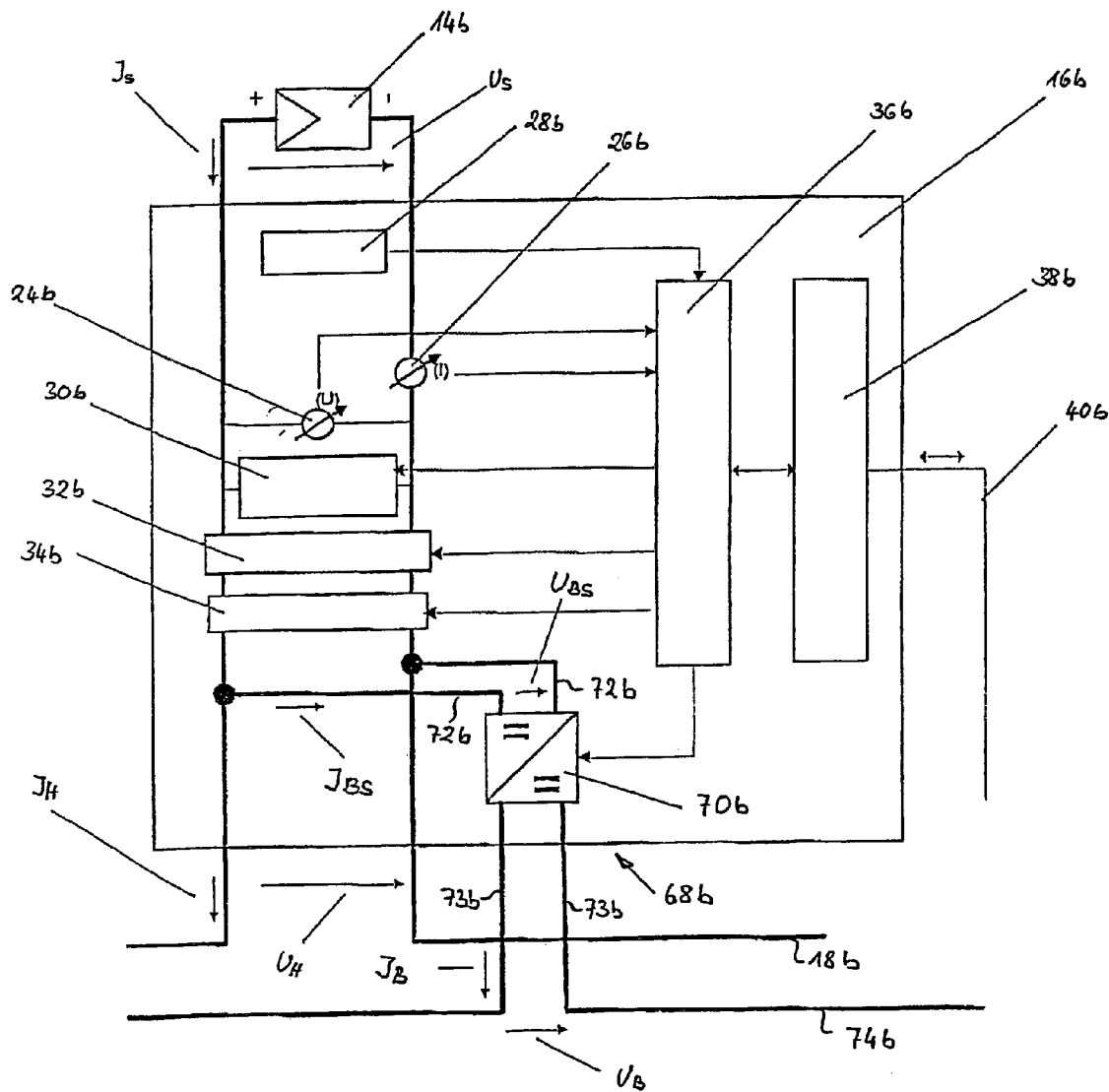
FIG. 9 a schematic view of a bypass/diagnostic unit with data bus.

For a detailed explanation of the circuit arrangement, reference is made to FIG. 9, which shows a detailed view of a solar generator 14b with energy bypass 68b. As shown in FIG. 9, the energy bypass 68b is essentially comprised of a controllable/regulatable bypass element 70b in form of a controllable/regulatable DC/DC converter, which is connected through two lines 72b with the output of the solar generator simulator 34b and through additional lines 73b to an energy bypass path 74b through which the bypasses of a string 12b, as shown in FIG. 8, are connected in series, with the energy bypass paths of a plurality of strings 12b arranged in parallel being interconnected in parallel.

As already described with reference to FIGS. 1 and 3, a string of solar generators connected in series is a system of equal currents, with the current through each solar generator connected in series being equal. For this reason, the current in the system is largely determined by the solar generator with the lowest MPP current. As a result of the bypass circuit, the appropriate differential current in solar generators with an MPP current higher than the MPP current of the weakest module is branched off and after potential separation and possible transformation, the corresponding energy is fed into an independent bypass energy path 74b. The energy fed into the bypass energy path 74b is additionally made available to the overall system according to the respective application. This correspondingly increases the effectiveness of the overall system.

The bypass circuit and/or the energy bypass 68b is galvanically separated. Thus, the output of the respective bypass circuit can be connected independently of the relevant voltage level of the respective solar generator and thus independently of the interconnection of the solar generators 14b. Connecting the individual energy bypass circuits allows for the connection of the individual energy bypass elements in series as well as in parallel, which will be described later. FIG. 9 shows that the energy bypass 68b is arranged parallel to the respective solar generators 14b in solar generators 14b connected in series.

According to FIG. 8, the bypass energy is directly fed back to the main energy path 18b, which requires an appropriate control/regulation of the voltage and currents in the bypass energy path 74b. This means, for example, that the voltage of the energy bypass in an energy bypass 68b is adjusted through the central control/regulation of the voltage and/or the controllable/regulatable bypass element itself so that the voltage level of the energy bypasses connected in series (outputs of the energy bypass elements) corresponds to the voltage of the main energy path 18b.

To that end, it should be noted that energy bypasses connected in series on their own are a system of equal currents, which requires that the performance/power equivalent to be processed by the bypass circuit must be transformed to a uniform current, with the sum of the voltages of all energy bypasses connected in series corresponding to the voltage of the entire string. The performance/power equivalent is controlled appropriately by varying the strength of the current. The control of the bypass current and the bypass voltage can be effected either centrally by evaluating all measuring data of the individual solar generators, or it can be effected partially independently by the controllable/regulatable bypass element itself. This means that with energy bypasses connected in series, the voltage level is adjusted through a central control/regulation of the voltage and the current and/or the controllable/regulatable bypass element itself so that the sum of the voltages of all energy bypasses connected in series corresponds to the level of the main energy path 18b.

Figure 10:
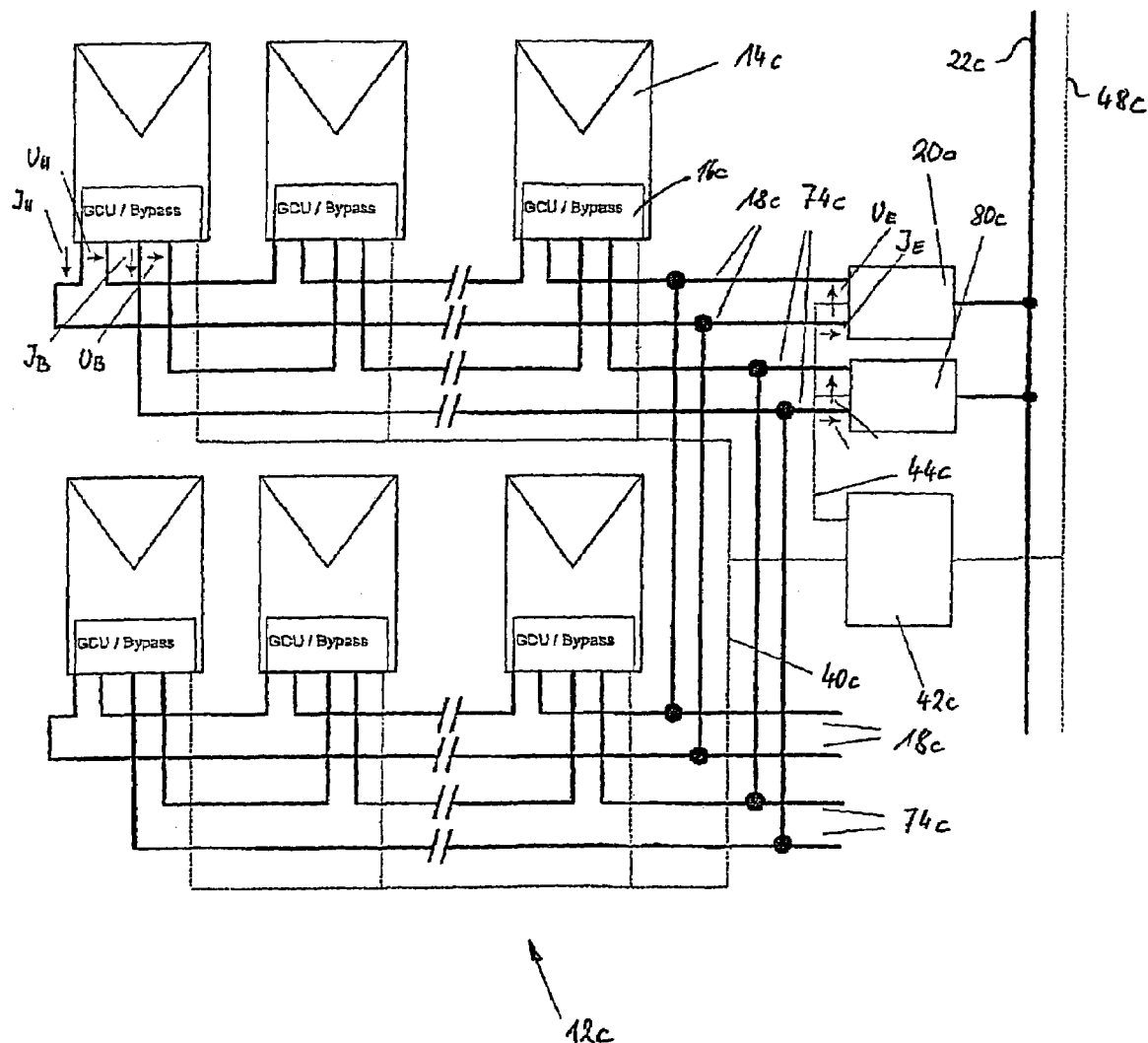
FIG. 10 a schematic view of a photovoltaic system with two parallel solar generator strings, solar generators with bypass/diagnostic unit and energy bypass connected in series with energy feed through a second converter into an energy network.

The essential difference between the circuit arrangement in FIG. 10 and the circuit arrangement in FIG. 8 is that in FIG. 10, the energy bypass paths 74c are not led back into the main energy path 18c, but rather are connected to a central energy network (such as an alternating voltage network, direct voltage-network) 22c by means of a second energy converter (such as an inverter) 80c and leads the bypass energy to said energy network.

Figure 11:
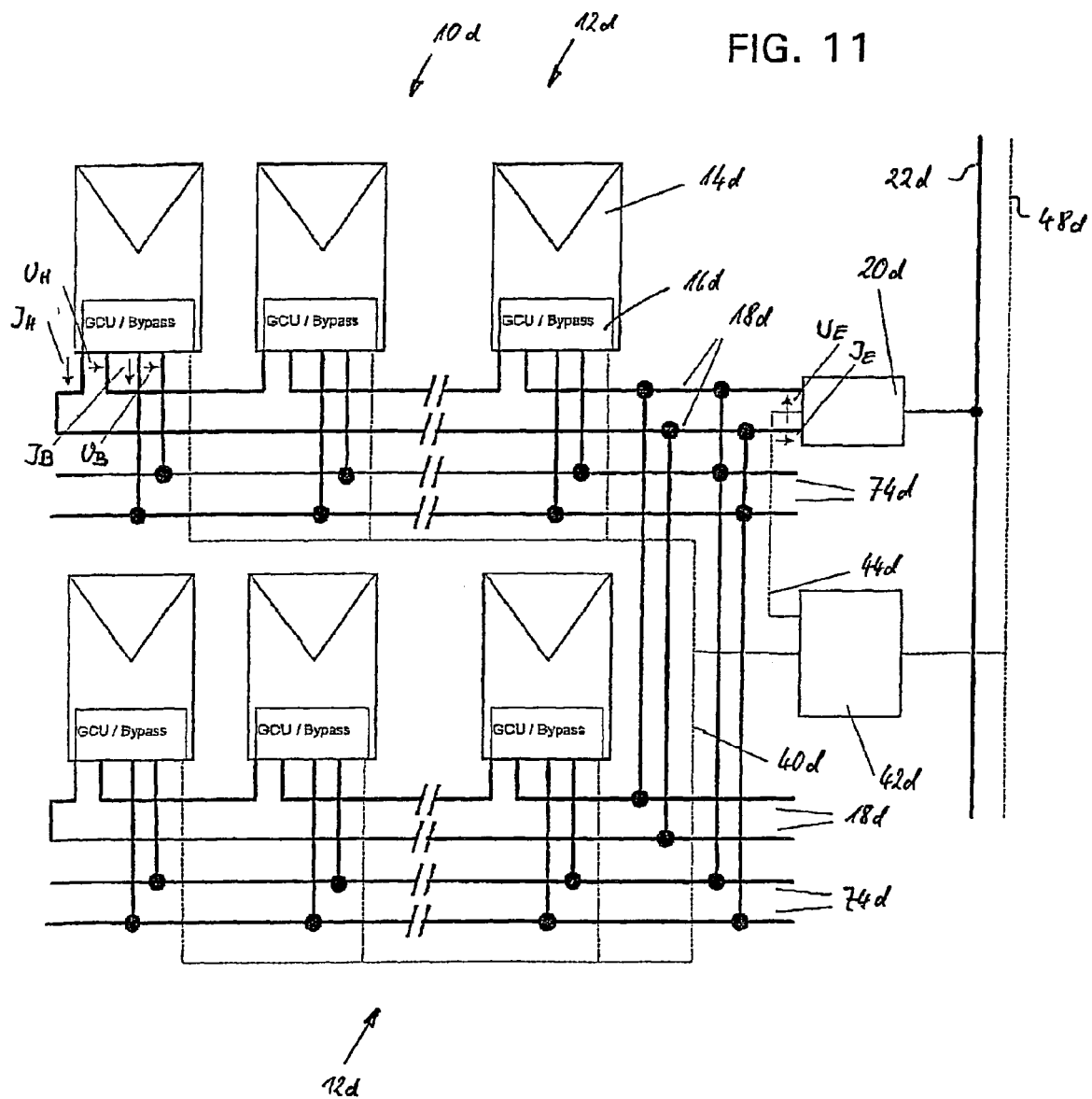
FIG. 11 another schematic view of a photovoltaic system with two parallel solar generator strings with solar generators with bypass/diagnostic unit and energy bypass connected in parallel and direct feed into the main energy pass.

The circuit arrangement according to FIG. 11 is based essentially on the circuit arrangement according to FIG. 8 described above, but with the difference that instead of the serial interconnection of the energy bypasses as described in FIG. 8, said energy bypasses are now connected in parallel. It should be noted that energy bypasses connected in parallel are on their own a system of equal voltage, which requires that the performance/power equivalent to be processed by the bypass circuit must be transformed to a uniform voltage. The performance/power equivalent is controlled appropriately by varying the current strength. The control of the bypass current and the bypass voltage can be effected either centrally by evaluating all measuring data of the individual solar generators or partially independently by the controllable/regulatable bypass element itself. This means that with energy bypasses connected in parallel, the voltage level of the energy bypass path 74d is adjusted to the level of the main energy path 18d by centrally controlling/regulating the voltage and/or by the controllable/regulatable bypass element itself.

A function principle and/or a method for the control/regulation of a photovoltaic system is described in the following using FIG. 11. As is shown, the solar generators 14d are connected in series into strings 12d. By connecting the bypass lines 74 in parallel in the system, the bypass energy is directly reconnected to the main energy path 18d and made available to the inverter 20d. The inverter 20d connected to the string 12d is set to the point of maximum string performance MPP string. Based on its properties and/or external influences, each solar generator 14d connected in string 12d has its own U-I-performance/power curve. Thus, each solar module also has its own MPP (point of maximum performance). The performance in MPP is calculated as follows.

$$P_{MPP} = I_{MPP} \times U_{MPP}$$

First, the lowest value $I_{MPP\ (min)}$ of the $I_{MPP}$-values of all solar modules connected in the string is determined. Thus, the following applies: $I_{MPP\ (min)} < I_{MPP\ (x)}$ (x=1 ... n).

The bypass current $I_B$ ($I_{Bypass\ Out\ (x)}$) of each individual solar module 14d is set to the difference between the MPP current of the appropriate module and $I_{MPP\ (min)}$.

$$I_{BypassIN(x)} = I_{MPP(x)} - I_{MPP(min)};\ (x=1 \ldots n).$$

The DC/DC converter (the bypass element) is controlled/regulated such that the respective current $I_{BS}$ ($I_{BypassIN(x)}$) at the input of the DC/DC converter 70d corresponds exactly to the current $I_{Bypass(x)}$. On the secondary side, this causes the feed of a corresponding current $I_B$, which corresponds to the performance/power equivalent on the primary side, into the main energy path 18d at a given string voltage.

The voltage $U_B$ at the output of the DC/DC converter (energy bypass) corresponds to the string voltage due to the direct coupling to the string (main energy path 18d).

The current $I_B$ ($I_{Bypass\ Out\ (x)}$) at the output of the DC/DC converter 70d (energy bypass) results from the corresponding performance/power to be transmitted.

$$I_{Bypass\ Out\ (x)} = (U_{MPP(x)} \times (I_{MPP\ (x)} - I_{MPP(min)}))/U_{String}$$

Because of the parallel connection of the bypass branches, the bypass currents $I_{Bypass\ Out}$ of the respective solar generators are summed up.

Figure 12:
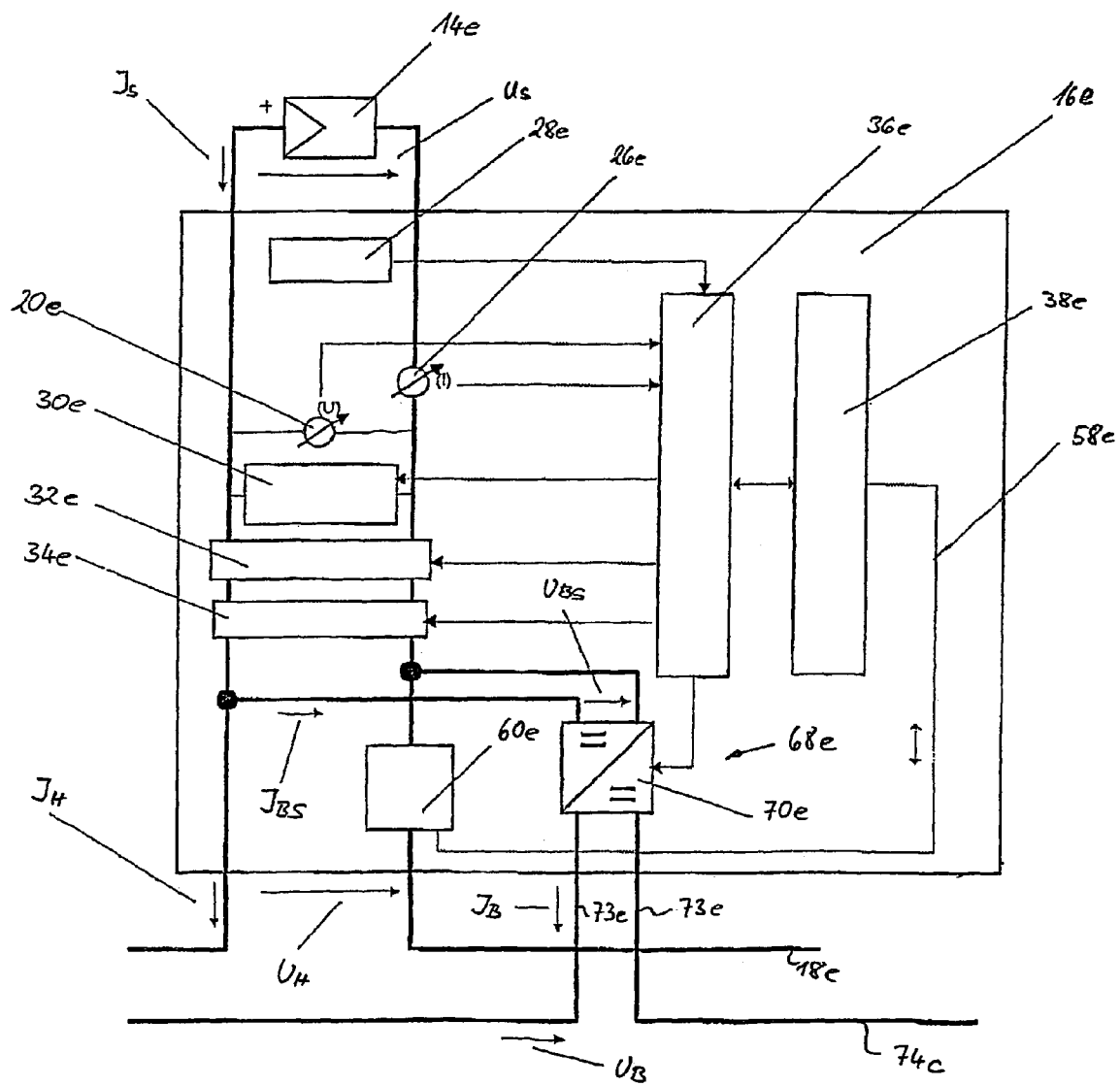
FIG. 12 a schematic view of a bypass/diagnostic unit with data modulation.

The only difference between the circuit arrangement shown in FIG. 12 and the circuit arrangement shown in FIG. 9 is that the communication unit 38e does not transfer data to be communicated through its own data bus to the LMU, for example, according to the embodiment in FIG. 7, but that all data to be transmitted are modulated on the main energy path 18e by means of a data coupler/decoupler and/or a modulation/demodulation unit 60e.

Figure 13:
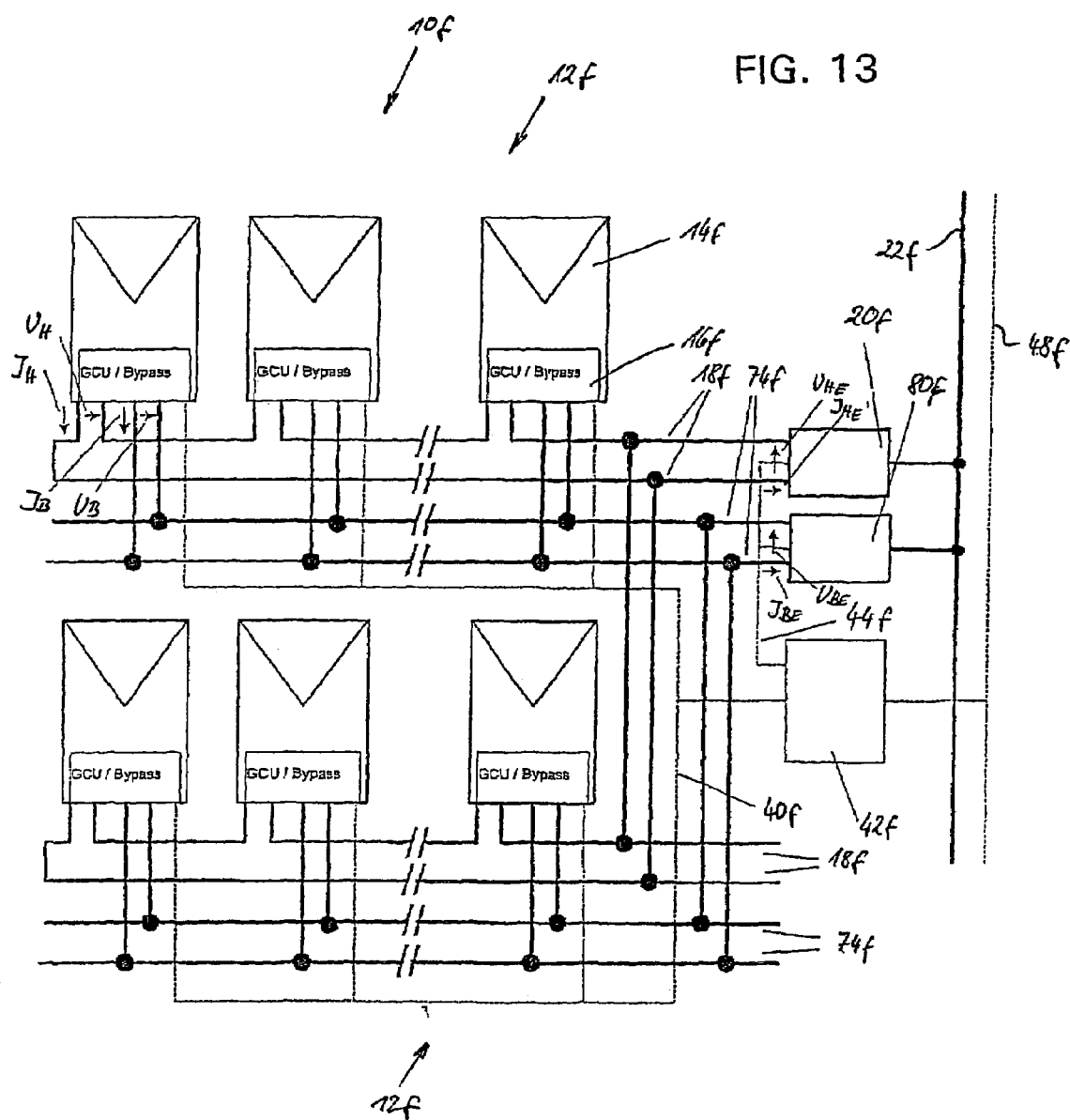
FIG. 13 a schematic view of a photovoltaic system with two parallel solar generator strings, solar generators with bypass/diagnostic unit and energy bypass connected in parallel with energy feed through a second converter into an energy network.

The only difference between the circuit arrangement in FIG. 13 and the circuit arrangement in FIG. 11 is that in this embodiment, the bypass energy is not fed to the main energy path 18f, but rather is connected to the energy network 22f by a separate energy converter and/or inverter 80f according to FIG. 10.

Figure 14:
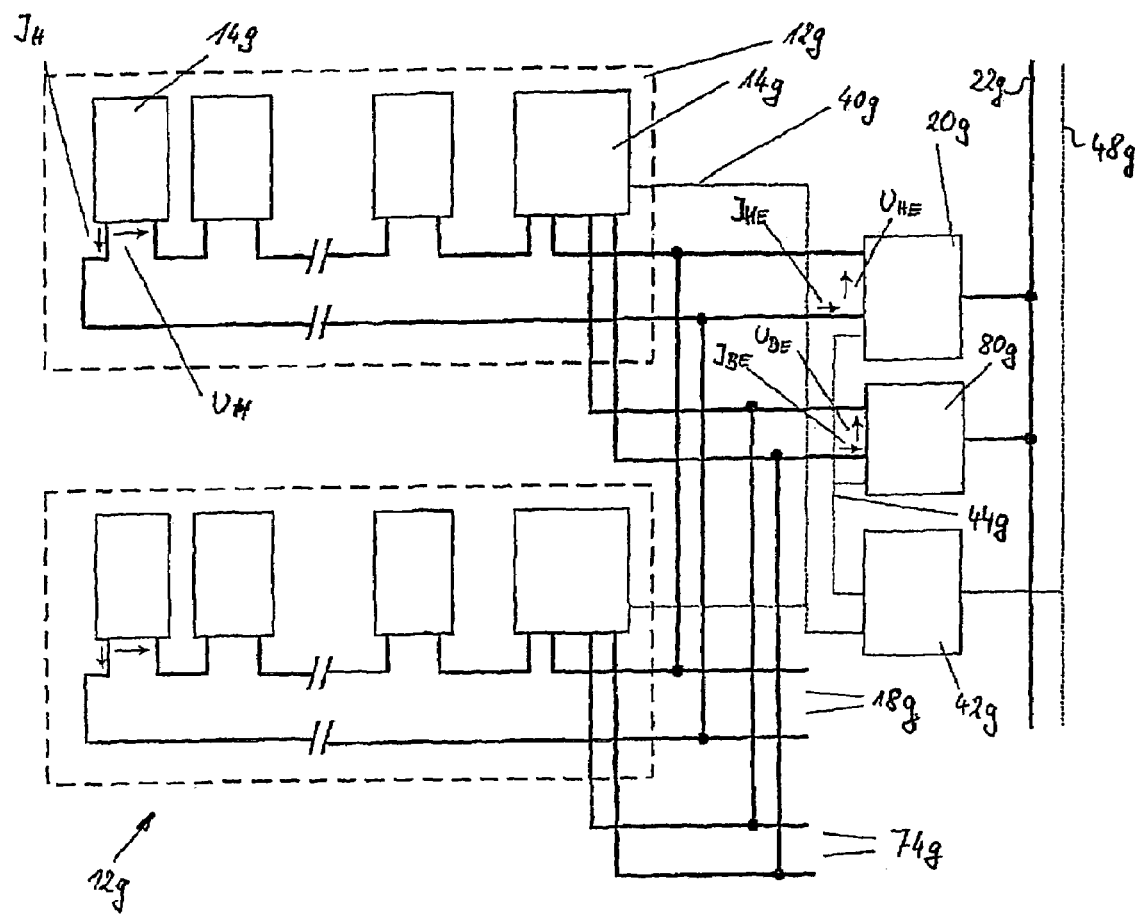
FIG. 14 a schematic view of a photovoltaic system with two parallel solar generator strings, solar generators with bypass/diagnostic unit and energy bypass connected in parallel with energy feed through a second converter into an energy network.
Figure 15:
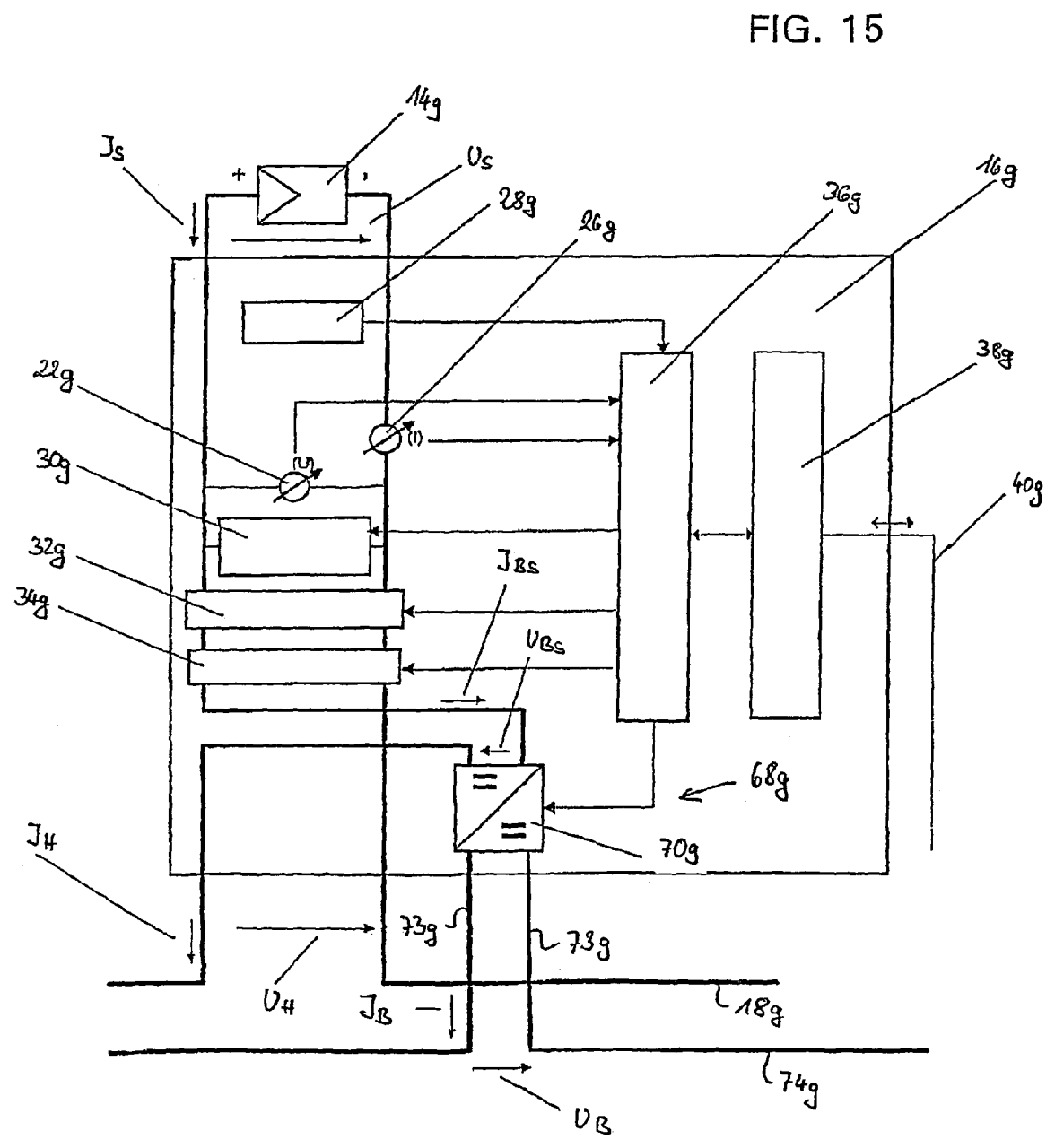

The essential difference between the circuit arrangement in FIGS. 14 and 15 and the circuit arrangements described above is that the solar generators 14g are connected in parallel in this embodiment, i.e., that this is principally a system with equal voltage. The voltage on each of the solar generators connected in parallel is the same. Because the MPP voltages of the individual solar generators vary, an optimal operation is possible only with an adjustment of the voltage.

The voltage in the system is largely determined by the solar generator with the lowest MPP voltage. The shown energy bypass circuit, which is arranged in series to the "individual" solar generator, builds up the corresponding differential voltage in series to the respective solar generator in the solar generators 14g having MPP voltage greater than the MPP voltage of the weakest solar generator, and after separating the potential and possible transformation, the corresponding energy is fed into an independent bypass energy path 74g and—as shown in FIG. 14 only by example using three solar generators 14g of two strings 12g—fed independently of the main energy path 18g corresponding, for example, to the FIG. 13 described above, into the energy network 22g by means of a separate energy converter 80g.

Figure 16:
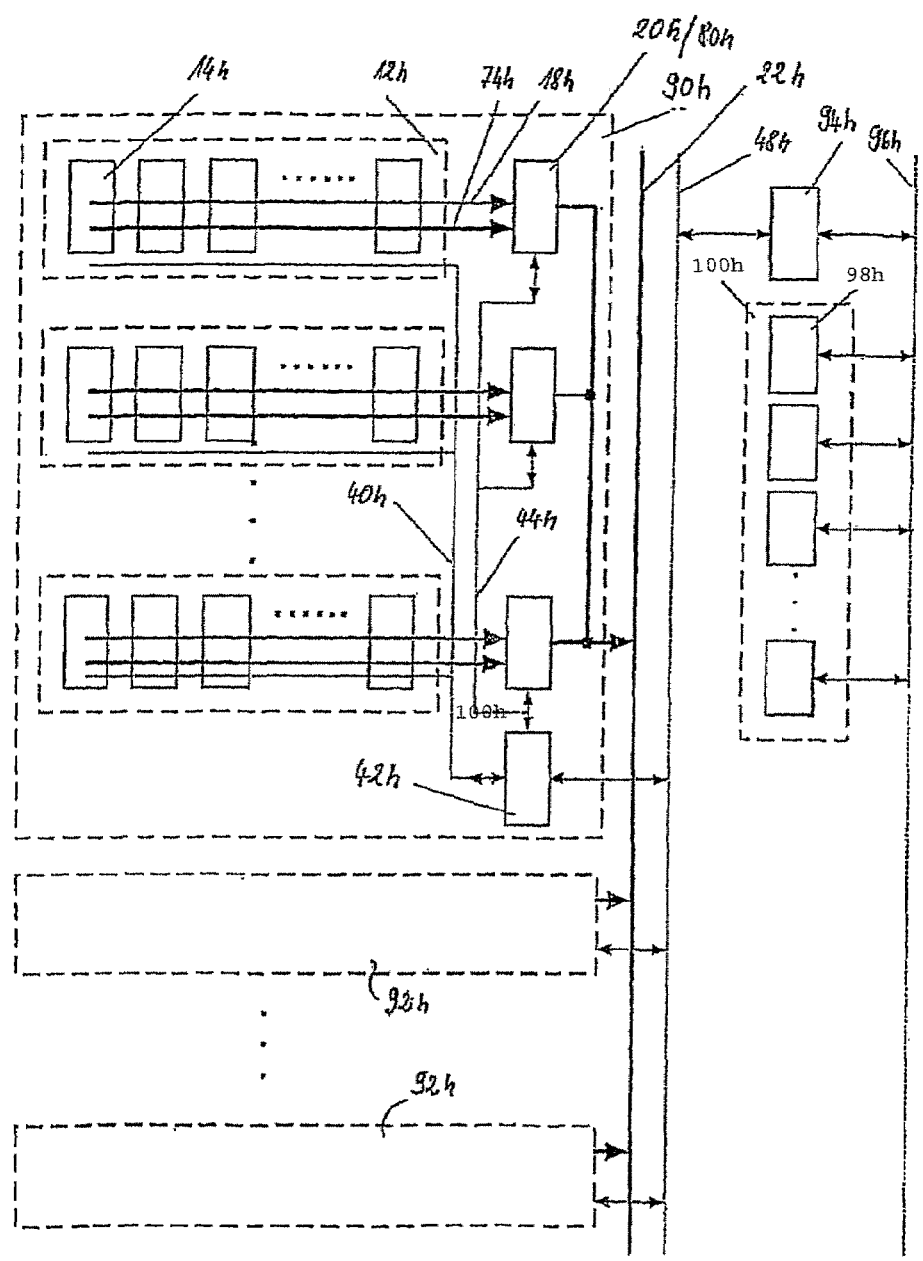
FIG. 16 a simplified illustration of the overall system.

The overall representation of the circuit arrangement shown in FIG. 16 is essentially based on the photovoltaic system shown in FIG. 13, of which, however, a plurality is connected to a respective solar power plant 90h in FIG. 16. As in FIG. 13, the system comprises groups of connected solar generators 14h with GCUs (including the diagnostic and/or bypass circuits [not shown] in said systems), which are connected to respective energy converters 20h and/or 80h through main energy paths 18h and bypass energy paths 74h to feed into a central energy network 22h, a data bus 40h, which connects the individual solar generators 14h with an LMU 42h, as well as another data bus 44h, which connects the LMU 42h with the individual energy converters 20h and/or 80h. In addition to the solar power plant 90h, additional solar power plants 92h, which are constructed according to the solar power plant 90h, are shown schematically.

The LMU 42h is connected to a global network 48h that is connected to another global network 96h through a global management unit (GMU) 94h in the shown example, and said global network 96h in turn is connected to individual users 98h or system operators and/or a group of users 100h or system operators. However, it is also conceivable that the individual users 98h or system operators and/or the group of users 100h or system operators are connected directly to the global network 48h.

The data of all solar generators 14h are transmitted cyclically to the local processing- and/or management unit (LMU) through the common data bus 40h. Because the components are already electrically connected, the lines for the energy transfer can also be used as data bus. In the global processing- and/or management unit (GMU), the data are secured centrally and evaluated across systems. The data are transferred cyclically via DFÜ and/or direct connection. Based on the measuring data and taking into account the respective ratings as well as the timeline, appropriate algorithms and/or a local expert system can be used to determine the condition of the appropriate solar generators and/or causes of errors.

Finally, it should be pointed out that the photovoltaic elements generally referred to as solar generator and/or generator include a solar cell, groups of solar cells (solar cells connected in parallel and/or in series), a solar cell module with a plurality of solar cell groups connected in parallel and/or in series, modules and/or groups of modules connected in series into a string, groups of strings connected in parallel, and the like.

The invention claimed is:

1. A circuit arrangement for controlling/regulating photovoltaic systems with a main energy path comprising a plurality of solar generators connected in series and/or in parallel, wherein each solar generator is associated with an individual controllable/regulatable variable energy bypass which is configured to supply at least part of a differential energy between the theoretically possible maximum energy output of said solar generator and its energy output that may, depending on the circuit arrangement, in fact be dissipated through said main energy path.

2. The circuit arrangement according to claim 1, wherein said variable energy bypass is controlled/regulated by a control/regulating unit such that each solar generator is operated continuously in its respective current, specific maximum power point (MPP).

3. The circuit arrangement according to claim 1, wherein the energy bypass comprises a galvanically separating controllable/regulatable energy converter.

4. The circuit arrangement according to claim 1, wherein the solar generator of a plurality of solar generators connected in serial, which has at a given time the lowest maximum power point (MPP) current of all of the solar generators in the serial circuit arrangement, sets the controlling/regulating variable for the energy bypass of the other solar generators in the serial circuit arrangement.

5. The circuit arrangement according to claim 1, wherein the solar generator of a plurality of solar generators connected in parallel, which has at a given time the lowest maximum power point (MPP) voltage of all of the solar generators in the parallel circuit arrangement, sets the controlling/regulating variable for the energy bypass of the other solar generators in the parallel circuit arrangement.

6. The circuit arrangement according to claim 1, wherein at least one energy bypass path is provided through which the energy bypass associated with each of said plurality of solar generators is interconnected in series and/or in parallel.

7. The circuit arrangement according to claim 6, wherein the energy bypass path is connected to the main energy path.

8. The circuit arrangement according to claim 6, wherein the main energy path and/or the energy bypass path is connected to an energy network power grid or a battery system.

9. The circuit arrangement according to claim 6, wherein the main energy path and/or the energy bypass path have an associated energy converter.

10. The circuit arrangement according to claim 1, wherein a control/regulating means is associated with each solar generator and/or a part of the solar generators to control/regulate the energy bypass and/or the diagnostic means.

11. The circuit arrangement according to claim 1, wherein a data processing- and memory unit is associated with each solar generator and/or a part of the solar generators.

12. The circuit arrangement according to claim 1, wherein a communications means is associated with the circuit arrangement to allow a communication of the solar generator operating parameters and ratings to other solar generators and/or communications- and/or control/regulating means and/or data processing- and memory units.

13. The circuit arrangement according to claim 12, wherein the communication is effected through a data line and/or the main energy path and/or a bypass energy path.

14. The circuit arrangement according to claim 1, wherein the energy bypass is controlled/regulated by current and/or voltage.

15. A circuit arrangement for controlling/regulating photovoltaic systems with a main energy path, comprising a plurality of solar generators connected in series and/or in parallel, wherein each solar generator or a part of the solar generators is associated with an individual diagnostic means which is configured to record repeatedly the operating parameters and/or ratings during operation of the solar generator or a part of the solar generators, and wherein said diagnostic means has an associated system decoupling unit that is configured to separate the solar generator or a part of the solar generators from a main energy path for the duration of the recording of the operating parameters and/or ratings.

16. The circuit arrangement according to claim 15, wherein a solar generator simulator is associated with the diagnostic means, which replaces the solar generator for the duration of the recording of the operating parameters and/or ratings with respect to its energy output.

17. The circuit arrangement according to claim 16, wherein the solar generator simulator is connected such that it supplies the main energy path with energy for the duration of the recording of the operating parameters and/or ratings.

18. The circuit arrangement according to claim 15, wherein the diagnostic means comprises a temperature- and/or current- and/or voltage measuring unit for recording the current operating parameters of the solar generator.

19. The circuit arrangement according to claim 15, wherein an operating point control element is associated with the circuit arrangement and sets the operating point during the recording of the operating parameters and/or ratings.

20. The circuit arrangement according to claim 15, wherein a variable energy bypass is associated with each solar generator, which variable energy bypass is configured to supply at least part of a differential energy between a theoretically possible maximum energy output of said solar generator and an energy output that may, depending on a circuit, in fact be dissipated through said main energy path.

21. The circuit arrangement according to claim 20, wherein the system decoupling unit is also configured to separate the solar generator from an energy bypass path for the duration of the recording of the operating parameters and/or ratings.

22. The circuit arrangement according to claim 20, wherein the solar generator simulator also supplies the energy bypass path with energy for the duration of the recording of the operating parameters and/or ratings.

23. A method for the control/regulation of photovoltaic systems comprising a plurality of solar generators connected in series and/or in parallel, wherein in order to determine the system maximum power point (MPP), the maximum power point (MPP) of only a part of the solar generators connected in series is determined and the system maximum power point (MPP) is derived from said maximum power point (MPP) determined for the part of the solar generators connected in series.

24. A method for controlling/regulating an energy bypass in a photovoltaic system comprising a plurality of solar generators connected in series or/and parallel, to each of which is assigned one controllable/regulatable variable energy bypass, wherein said controllable/regulatable variable energy bypass is controlled/regulated such that each solar generator is continuously operated in its respective current, specific MPP.

\* \* \* \* \*